United States Patent [19]

Suzuki et al.

[11] 4,059,837

[45] Nov. 22, 1977

[54] GLASS-MOULDED TYPE SEMICONDUCTOR DEVICE

[75] Inventors: Kensuke Suzuki; Takeshi Sasaki; Mitsuyuki Matsuzaki, all of Hitachi, Japan

[73] Assignee: Hitachi, Ltd., Japan

[21] Appl. No.: 673,530

[22] Filed: Apr. 5, 1976

[30] Foreign Application Priority Data

Apr. 7, 1975   Japan ............................ 50-41293
Apr. 7, 1975   Japan ............................ 50-41294

[51] Int. Cl.² ............... H01L 23/30; H01L 23/48; H01L 29/40
[52] U.S. Cl. ............................ 357/73; 357/65; 357/67; 357/68; 357/71; 357/74
[58] Field of Search .................. 357/65, 67, 68, 71, 357/73, 74

[56] References Cited

U.S. PATENT DOCUMENTS

| 3,032,695 | 5/1962 | Zielasek | 357/67 |
| 3,237,272 | 3/1966 | Kallander | 357/73 |
| 3,365,628 | 1/1968 | Luxem et al. | 357/73 |
| 3,913,127 | 10/1975 | Suzuki et al. | 357/73 |
| 3,930,306 | 1/1976 | Goldberg et al. | 357/67 |

*Primary Examiner*—Andrew J. James
*Attorney, Agent, or Firm*—Craig & Antonelli

[57] ABSTRACT

A semiconductor device according to the present invention comprises a silicon pellet adhesively fixed with a soft solder between a pair of leads provided with headers and having a thermal expansion coefficient greatly different from those of the silicon pellet and mould glass. An assembly including the silicon pellet is then glass-moulded to provide semiconductor device. The leads are provided with a film having low wetness to glass for preventing a breakage of the mould glass due to the difference between the thermal expansion coefficients.

28 Claims, 6 Drawing Figures

GLASS-MOULDED TYPE SEMICONDUCTOR DEVICE

The present invention relates to a glass-moulded type semiconductor device using lead electrodes whose thermal expansion coefficient differs remarkably from those of a semiconductor and mould glass.

A semiconductor pellet such as a diode must be sealed within a gas-tight casing in order to avoid mechanical damages and to be insulated from harmful impurities in the atmosphere for improvement in reliability. A method for making the gas-tight casing is, for example, a method in which the semiconductor pellet is moulded by glass. The glass with its composition selected functions as a passivation material, so that the direct printing of the glass to the semiconductor allows the mould (gas-tight casing) to be provided with the result of a simlified and miniaturized semiconductor device and simplified manufacturing process.

On the other hand, electrodes for fixedly supporting the semiconductor pellet by means of an adhesive solder are made of molybdenum or tungsten whose thermal expansion coefficient is approximate to that the semiconductor pellet so that the latter may be prevented from being broken due to a thermal stress developed by heating required at a time when it must be fixedly supported.

Molybdenum or tungsten is effective as an electrode material, but most disadvantageously expensive.

A lead of copper is, on the other hand, often welded for connection to external circuits, but copper has a poor welding property to molybdenum or tungsten, and the corrosion resistance at portions to be welded must be, therefore, considered.

Generally, aluminum is used as an adhesive solder because the glass is heated up to temperatures of about 700° C when it is melted as moulding material for printing. The aluminum, however, serves as acceptor relative to the semiconductor pellet, so that an n-type conductive region must be formed at its surface (to be adhesively fixed) with a region of impurities of high concentration in order to avoid the formation of a p-type inverted layer. This causes problems of deformation of a semiconductor wafer and reduction in yield due to non-uniformity of impurity concentration.

An object of the present invention is to provide a glass-moulded type semiconductor device excellent in corrosion resistance and economy and free from the breakage of a semiconductor pellet or mould glass due to a thermal stress, wherein electrodes are made integral with a lead to provide lead electrodes whose thermal expansion coefficient differs remarkably from that of the semiconductor pellet.

Another object of the present invention is to provide a glass-moulded type semiconductor device having no harmful influence upon a semiconductor pellet during manufacturing.

Still another object of the present invention is to provide a glass-moulded type semiconductor device having more perfect air-tight sealing of a semiconductor pellet and manufactured with ease.

A semiconductor device according to the present invention is characterized in that, with the aid of a soft solder (solder material having a low melting point) such as lead-silver-tin solder, a semiconductor pellet is adhesively fixed to lead electrodes with a header provided, made of a material such as copper whose thermal expansion coefficient is much greater than that of the semiconductor pellet or mould glass, and that the semiconductor pellet is moulded by glass provided with a passivation function. The lead electrode is further provided with a film for preventing the mould glass to be adhesively fixed hereto. Thus, the mould glass adheres only to the semiconductor pellet. The lead electrode is provided at its surface to be fixed to the semiconductor pellet with a stopper for preventing the soft solder from flowing away during the manufacturing, and preventing the compositions of the semiconductor pellet and lead electrode from diffusing to each other through the soft solder to have a harmful influence particularly upon the semiconductor pellet. Furthermore, the lead electrode is provided at a portion a predetermined distance spaced from a header portion with a flange, which is used to sandwich the glass in cooperation with the header portion with the aid of the difference of thermal expansion coefficient between the lead electrode and glass in order to provide the complete gas-tight sealing of the semiconductor pellet.

Figure 1:
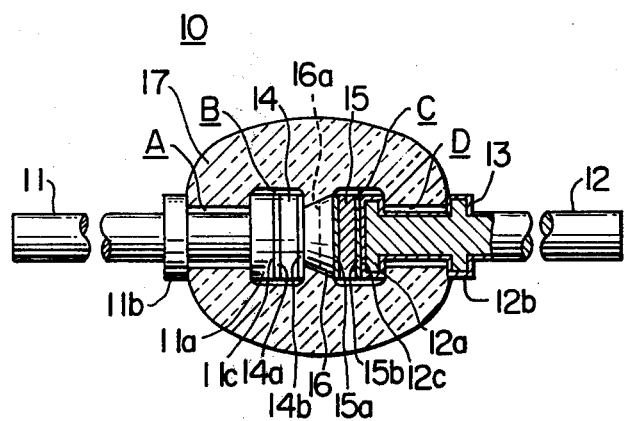
FIG. 1 is a longitudinal section of a glass-moulded type diode showing one embodiment according to the present invention.

In FIG. 1 there are shown a glass-moulded type diode 10 according to the present invention and a pair of lead electrodes 11, 12. The electrodes 11, 12 are made of copper (having a thermal expansion coefficient of $16 \times 10^{-6}/°$ C) or an alloy of copper added with a small amount of zirconium to increase in hardness, the thermal expansion coefficient of which is much greater than that of silicon (having the thermal expansion coefficient of $3.51 \times 10^{-6}/°$ C). The lead electrodes are formed at their one end with header portions 11a, 12a for adhesively fixing a silicon pellet, which will be described hereinafter, and with flange portions 11b, 12b at portions at a predetermined distance from these header portions 11a, 12a. The header portions 11a, 12a and flange portions 11b, 12b are manufactured with ease by pressing a copper wire having a predetermined thickness. The lead electrodes 11, 12 are coated with a film such as a nickel film 13 non-adhesive to glass. The film 13 non-adhesive to glass may be provided at least within the range corresponding to the elongation of the mould glass to be described hereinafter, that is, within the range from the header portions 11a, 12a to flange portions 11b, 12b, but can be provided up to the top approximately near to the flange portions 11b, 12b without any obstruction.

The header portions 11a, 12a have stoppers 14, 15 fixed at their surfaces 11c, 12c to which the silicon pellet adheres. The stoppers 14, 15 are made of an iron-nickel alloy and serve particularly to prevent the silicon pellet from becoming weak due to a mutual diffusion from copper to silicon and vice versa. The stoppers 14, 15 are previously clad at both their sides with a soft solder (Pb—Ag—Sn solder) 14a, 14b, 15a, 15b used as an adhesive material for adhesively fixing the lead electrodes 11, 12 and the silicon pellet to be described hereinafter. The soft solders 14b, and 15a on one side to which the silicon pellet adheres have a lower limit restricted in thickness from the viewpoint of defective adhesion and an upper limit restricted from the viewpoint of defective resistance to pressure, and are, therefore, selected to range in thickness from 10 to 80μ.

It is to be noted that the silicon pellet and the lead electrodes 11, 12 are pressed during soldering operations according to a standard at pressures 0.19 to 0.62 g/mm$^2$ typical for a pressure at the soldering.

A silicon pellet 16 serving as a diode has a mesa structure in which a p-n junction 16a extends a the surface of its lateral circumference. The silicon pellel 16 is provided with an intermediate film (not shown) such as nickel, gold because the solder cannot adhere directly thereto.

If the lead electrodes 11, 12, stoppers 14, 15 and silicon pellet 16 are all prepared, then they are stacked in a longitudinal hole of a carbon-made jib in the order of the lead electrode 11, stopper 14, silicon pellet 16, stopper 15 and lead electrode 12 or in the reversed order and then heated up to temperatures of about 300° C at which the solder provided on the stoppers 14, 15 is melted. They are then made solid to provide a sub-assembly comprising the silicon pellet 16 sandwiched between the pair of lead electrodes 11, 12.

Once the sub-assembly has been prepared, a slurry containing a mixture of distilled water or deionized water with a frit of ZnO—B$_2$O$_3$—SiO$_2$ glass (having a thermal expansion coefficient 4 × 10$^{-6}$/° C) which has a passivation effect to the p-n junction 16a and whose thermal expansion coefficient is approximate to that of silicon is dropped in the proximity of the silicon pellet 16. The sub-assembly is then rotated and heated to burn mould glass 17.

The glass-moulding operation is effected by heating at temperatures of about 700° C. The soft solders 14a, 14b, 15a, 15b are, on the other hand, kept in a melted state at the greater part of time when the mould glass 17 is melted or made solid because they begin to solidify at temperatures of about 200° C. As a result, the silicon pellet 16 has no adhesion to the stoppers 14, 15. For this reason, the thermal stress is hardly exerted on the silicon pellet 16.

When glass was used as a moulding material, expensive tungsten or molybdenum having the thermal expansion coefficient approximate to that of silicon was typically used as an electrode material in order to make the thermal stress exerted on the silicon pellet as small as possible. In the present invention, however, the thermal stress is made so small that the silicon pellet 16 is subject to only slight breakage without any help of tungsten or molybdenum. Further, the silicon pellet 16 is made inexpensive without any problem of corrosion because the lead electrodes 11, 12 are made integral.

The stoppers 14, 15 are non-adhesive to the soft solders 14a, 14b, 15a, 15b, so that they prevent the melted soft solders from flowing away. In this respect, the lead electrode 11-stopper 14-silicon pellet 16-stopper 15-lead electrode 12 can strongly adhere to each other with a predetermined required amount of soft solders 14a, 14b, 15a, 15b.

The stoppers 14, 15, made of an iron alloy have a thermal expansion coefficient intermediate between those of copper and silicon and thus have an effect to reduce a thermal stress exterted on a portion between the lead electrodes 11, 12 and silicon pellet 16.

The question arises that the sub-assembly must be disassembled because the soft solders 14a, 14b, 15a, 15b go into a melted state when the mould glass 17 is heated for burning to temperatures of about 700° C. In practice, however, the moulding operations of the glass 17 can be effected with ease because the surface tension of the soft solder causes the sub-assembly to be maintained without being disassembled in view of the fact that the stoppers 14, 15, and silicon pellet 16 are, respectively, on the order of 0.2 mm in thickness and 1.0 mm in diameter.

It has been a typical practice in the prior art to use soft solder which has a melting temperature higher than the heat temperature in moulding operations. For example, the soft solder has been used for a resin serving as the moulding material, and aluminum has been used as a solder material for glass as the moulding material. The solder material is, therefore, ketp solid at a heating temperature in the moulding operation. In the present invention, on the other hand, the solder material is kept in a melted state even during the moulding operation. In this respect, the present invention differs greatly from the prior art.

Aluminum serves as an acceptor for silicon, so that an n-type conductive region of high concentration must be conventionally provided at the adhesion surface of an n-type conductive region of the silicon pellet. In the present invention, however, the soft solder is used, which does not function as an acceptor, so that the n-type conductive region of high concentration need not be specially provided.

Typically, the silicon pellet is obtained by preparing a silicon wafer with the n-type conductive region of high concentration commonly formed in the step and then pelletizing the silicon wafer to a predetermined size. It is, however, difficult to form the n-type conductive region of high uniform concentration. The formation of such a region undesirably causes the silicon wafer to be bent, thereby making the working operations worse with the result of diffculty of improvement in yield.

In the present invention, steps of diffusing impurities decrease in number because the n-type conductive region of high concentration need not be provided, thus leading to an improvement in yield.

The film 13 is provided to prevent the mould glass 17 from being broken due to the difference of the thermal expansion coefficients to mould glass 17 and the lead electrodes 11, 12 (16 × 10$^{-6}$/° C in copper; 4 × 10$^{-6}$/° C in glass) by avoiding the adhesion of the mould glass 17 to lead electrodes 11, 12. The great difference of the thermal expansion coefficient of lead electrodes 11, 12 from that of the mould glass 17 causes small spaces to be defined between the lead electrodes 11, 12 and mould glass 17. The small spaces between the lead electrodes 11, 12 and the mould glass 17 can be defined without any film 13 on the lead electrodes 11, 12 if the mould glass 17 is burned in an inert atmosphere (for example, nitrogen gas). Thus, the mould (gas-tight sealing) of the silicon pellet 16 depends only upon the adhesion of the silicon pellet 16 to the mould glass 17.

In this respect, the flange portions 11b, 12b are provided to sandwich the mould glass 17 in cooperation with the header portions 11a, 12a with aid of a contraction of the lead electrodes 11, 12 to isolate the silicon pellet 16 from the external atmosphere. A to D show spaces defined between the lead electrodes 11, 12 and the mould glass 17 in the presence of the header portions 11a, 12a and the flange portions 11b, 12b. The presence of the flange portions 11b, 12b causes the glass in the form of slurry to adhere to the sub-assembly increasingly in amount when it is dropped onto the sub-assembly, and thus functions effectively to mould the subassembly with a large amount of glass.

Figure 2:
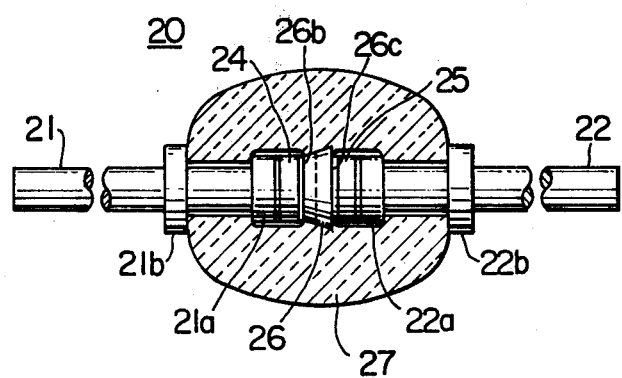
FIG. 2 is a longitudinal section of a glass-moulded type diode showing another embodiment according to the present invention.

FIG. 2 shows another embodiment of a glassmoulded type diode 20. In this embodiment, the characteristics exist in that header portions 21a, 22a of lead electrodes 21, 22 coincide in outer diameter with the diameter of a main surface 26b of small area on one side of a mesatype silicon pellet 26 (a main surface on the left side in the figure) and that flange portions 21b, 22b coincide in outer diameter with the diameter of a main surface 26c of large area on the other side of the silicon pellet 26 (a main surface on the right side in the figure). Stoppers 24, 25 coincide with the header portions 21a, 22a in pattern.

In the embodiment in FIG. 1, there is the danger that the glass slurry does not sufficientlly extend to a very small space defined by the stopper 14 and the main surface of small area on the left side of the silicon pellet at the time of burning the mould glass 17, so that voids are formed, which makes it difficult to effect the complete passivation of the p-n junction 16a. In the embodiment in FIG. 2, however, no microscopic space is defined by the stopper 24 and the main surface 26b of small area on the left side of the pellet. The moulding of the glass 27, therefore, causes little fear of formation of the voids with the result of the expectation of improvement in resistance to pressure.

Figure 3:
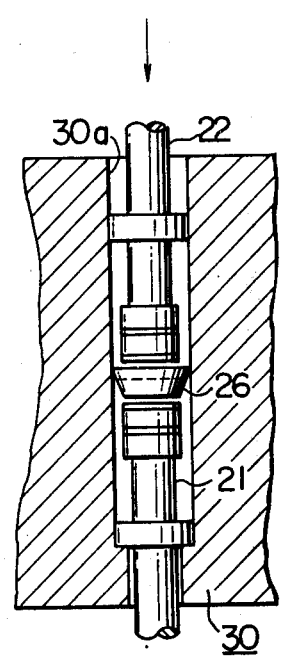
FIG. 3 is a view showing soldering operation in the glass-moulded type diode in FIG. 2.

If, as shown in FIG. 3, a longitudinal hole 30a of a jig 30 is constructed so as to substantially coincide in diameter with the flange portions 21b, 22b and the main surface of large area on the right side of the silicon pellet 26 in the formation of the sub-assembly, then the lead electrodes 21, 22 and the silicon pellet 26 can be brought into axial alignment when they are successively stacked therein as shown by an arrow, and thus the diode 20 having a precise dimension can be provided.

It is to be noted that the stoppers 24, 25 are previously fixed to the lead electrodes 21, 22, respectively, when it is intended that the stoppers 24, 25 should be prevented from displacement at the soldering operations.

Figure 4:
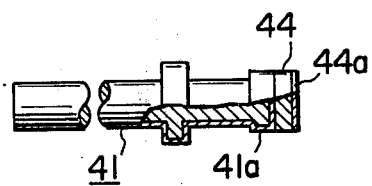
FIGS. 4 and 5 are partial section showing a lead electrode provided with a stopper applicable to the present invention.

In the embodiments in FIGS. 1 and 2, the stoppers are shown as being made of an iron alloy and clad with the soft solders at both the surfaces. In this case, the soft solders 14a, 14b, 15a, 15b, may be homogeneous or inhomogeneous. The iron alloy may be used as a stopper material without any modification when the silicon pellet 16, 26 are used which are provided at both the main surfaces with the soft solder through a metallic film such as nickel or gold having excellent adhesion to the soft solder. In this case, a stopper 44 may be welded to a header portion 41a of a lead electrode as shown in FIG. 4. For improvement in adhesion to the soft solder, the stopper 44 is preferably provided with a film 44a such as nickel or gold.

Figure 5:
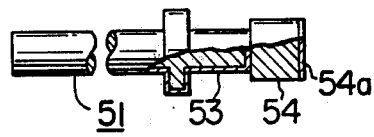

The stopper, made of an iron alloy, is preferably made as thin as possible because the iron alloy has electrical and thermal resistances greater than those of copper. The stopper can be, on the other hand, made thick to some extent as shown in FIG. 5. In this case, a stopper 54 is soldered or welded to a lead electrode 51 with a header of the lead electrode 51 with a header of the lead elctrode 51 eliminated. The stopper 54 instead serves as the header of the lead electrode 51. In the figure, 53 shows a nickel film for preventing the adhesion of the glass, and 54a a film such as nickel or gold for improving the adhesion of the soft solder.

In the above embodiments, the description has been made with reference to the stopper made of the iron alloy, but it will be understood that a stopper, made of a material such as molybdenum or tungsten whose thermal expansion coefficient is approximate to that of silicon may be used. This is due to the facts that such a material is made very thin for use as the stopper and causes no increase in cost, and that a portion to be soldered to the lead electrode is covered with the mould glass with the result of no problem of corrosion when the stopper is not welded to the lead electrode. Molybdenum or tungsten adheres to glass, but both thermal expansion coefficients are approximate to each other with the result of no fear of breaking the mould glass and preferential use from the viewpoint of improvement in gas-tightness of the silicon pellet. If the stopper and the silicon pellet are adhesively fixed with the soft solder, then the stopper can be adhesively fixed to the lead electrode with a hard solder without fixed to the lead electrode with a hard solder without any hindrance.

In the following, a glass-moulded type diode of simplified structure according to the invention will be described with the reference to FIG. 6.

Figure 6:
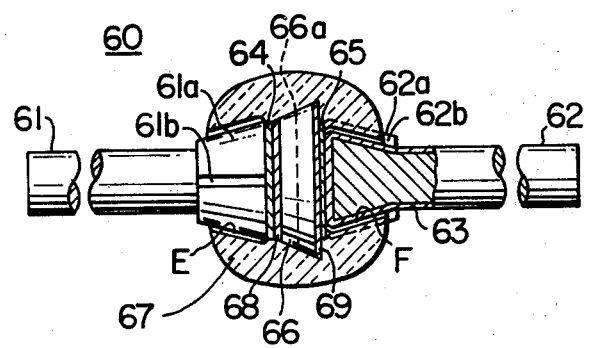
FIG. 6 is a longitudinal section of a glass-moulded type diode having a simplified structure, showing still another embodiment of the present invention.

In FIg. 6, there are shown a glass-moulded type diode according to the present invention, generally designated by 60, lead electrodes 61, 62 of copper and header portions 61a, 62a coated on whole surfaces of the lead electrodes 61, 62 with a nickel film 63 for preventing the adhesion of glass. A silicon pellet 66 of mesa-structure had the lead electrodes 61, 62 adhesively fixed on main surfaces on both sides through soft solders, 64, 65 (having compositions; Pb— 93.5%, Ag—1.5%, Sn—5.0%; and a temperature 307° C at which solidification begins). The silicon pellet 66 is previously coated with films 68, 69 of nickel or gold by plating or evaporation method for improvement in adhesion of the soft solders 64, 65 to the silicon pellet.

The silicon pellet 66 is sandwiched between the header portions 61a, 62a of the lead electrodes 61, 62 and made integral therewith the soft solders 64, 65 to provide a sub-assembly, which is moulded by a mould glass 67 as is the case with the abovementioned embodiments.

When the heating at the time of glass moulding causes copper of the lead electrodes 61, 62 and silicon of the pellet 66 to be diffused to each other and an alloy to be formed, there arise the fears of destroying the p-n junction 66a of the silicon pellet 66 and reducing the adhesive properties of the silicon pellet 66 and the lead electrodes 61, 62 because the copper-silicon alloy is a fragile metal. The nickel film 63 on the lead electrodes 61, 62 is, however, advantageous in that it prevents the mutual diffusion of the copper and silicon. This advantage is also obtained when the films 68, 69 on the silicon pellet 66 are made of nickel. If the films 68, 69 on the silicon pellet 66 are made of nickel and the mould glass is burned in the presence of an inert gas, then the nickel film 63 on the lead electrodes 61, 62 can be removed.

The presence of the nickel film 63 and the burning of the mould glass 67 in the presence of the inert gas prevent the mould glass 67 to adhere to the lead electrodes 61, 62. Further, a great difference between the thermal expansion coefficient of copper $16 \times 10^{-6}/°$ C (at temperatures of 30° to 540° C) and that of glass $4.47 \times 10^{-6}/°$ C (at temperatures of 30° to 540° C) causes spaces EF to be defined which surrounds the lateral circumference of the lead electrodes 61, 62. These spaces EF prevent the breakage of the mould glass 67 due to a thermal stress.

In this embodiment, the gas-tight sealing of the silicon pellet 66 depends only upon the adhesion of the mould glass 67 to the laterial circumference of the silicon pellet 66 because the lead electrodes 61, 62 are provided only with the header portions 61a, 62a, and with no flange portion.

The header portions 61, 62 are provided with a plurality of axial recesses 61b, 62b, into which the mould glass 67 projects and solidifies when it is burned for moulding. For this reason, the mould glass 67 is kept in engagement with the lead electrodes 61, 62 even if a torque appears between the lead electrodes 61, 62 and the mould glass 67. The silicon pellet 66, is, therefore, kept to be adhesive to the mould glass 67.

As shown in the figure, the header portions 61a, 62a are trapezoidal or in the form of a pigeon-tail and arranged so as to adhere on their sides of large area the silicon pellet 66.

The spaces defined between the mould glass 67 and the lead electrodes 61, 62 are so small, that the header portions 61a, 62a are brought into engagement with the mould glass 67 due to an expansion (elastic deformation) of the lead electrodes 61, 62 when a tension is excerted between the lead electrodes 61, 62. The tension is, therefore, absorbed into a strain between the lead electrodes 61, 62 and the mould glass 67 with the result of the escapment of the silicon pellet from the breakage.

The soft solders 64, 65 are held in a melted state up to a considerable temperature due to the heat developed at the time of burning and moulding of the glass 67 as in the above-mentioned embodiment, so that a small thermal stress is excerted on the silicon pellet 66.

The maintenance of the gas-tight sealing against a torque is achieved by the recesses 61b, 62b in the header portions 61a, 62a. This is due to the circumferential engagement, so that the header portions 61a, 62a can be provided with projections instead of the recesses with the same effect obtained.

In all the embodiments, the diode using a sheet of silicon pellet has been exemplified, but the present invention is applicable to a glass-moulded type diode for use in high-voltage rectification in a television receiver set or electronic range as disclosed in U.S. Pat. No. 3,913,127 in which a plurality of mesa-type silicon pellets are adhesively fixed in the form of a laminate with soft solders or with aluminum solders and provided with lead electrodes at both ends, and then moulded by glass over the range elongating from one lead electrode to the other.

As mentioned above, the present invention allows a glass-moulded type diode having required properties to be provided inexpensively and with ease without any effort to make the difference of thermal expansion coefficient between the materials small even if the diode receives a high-temperature treatment in a manufacturing process.

What we claim is:

1. A glass-moulded type semiconductor device comprising at least one semiconductor pellet having at least one p-n junction extending to a lateral circumferential surface, lead electrodes each having a thermal expansion coefficient much greater than that of said at least one semiconductor pellet and including a header portion to which said at least one semiconductor pellet can be adhesively fixed, a soft solder having a low melting point for adhesively fixing said lead electrodes to both sides of said at least one semiconductor pellet, and a mould glass having a passivation function to said at least one p-n junction of said at least one semiconductor pellet and adhesively fixed to said at least one semiconductor pellet all over the surface of its lateral circumference and having a thermal expansion coefficient substantially approximate to that of said at least one semiconductor pellet.

2. A glass-moulded type semiconductor device according to claim 1, wherein said lead electrodes are provided at least at their header portion with a film non-adhesive to said mould glass, and said mould glass is provided over a range elongating from the header portion of one of said lead electrodes to the header portion of the other.

3. A glass-moulded type semiconductor device according to claim 1, wherein said lead electrodes include a flange portion at a position a predetermined distance spaced from said header portion and are provided with a film which elongates at least from the header to flange portions and has non-adhesive property to the mould glass, and said mould glass is provided over a range elongating from the flange portion of one of said lead electrodes to the flange portion of the other.

4. A glass-moulded type semiconductor device according to claim 1, wherein said lead electrodes are made of copper or copper alloy and said at least one semiconductor pellet is made of silicon, and wherein a stopper for preventing the mutual diffusion of copper and silicon is provided between the header portion of said lead electrode and said at least one semiconductor pellet.

5. A glass-moulded type semiconductor device according to claim 3, wherein said at least one semiconductor pellet is of a mesa-type in structure having main surfaces different in area on both sides thereof, the header portion of said lead electrodes having a diameter substantially coinciding with a diameter of the main surface of small area on one side of said at least one semiconductor pellet, and the flange portion thereof having a diameter substantially coinciding with a diameter of the main surface of large area on the other side of said at least one semiconductor pellet.

6. A glass-moulded type semiconductor device according to claim 1, wherein the header portion of said lead electrodes is large in area on the side on which said at least one semiconductor pellet adheres thereto and small in area on the other side, and trapezoidal in section taken along a direction along with said at least one semiconductor pellet adheres thereto.

7. A glass-moulded semiconductor device comprising:
a semiconductor pellet structure including at least one *pn* junction which extends to a lateral circumferential surface bounded by first and second end surfaces;
a first lead electrode having a thermal expansion coefficient much greater than that of said semiconductor pellet structure, said first lead electrode having a header portion at one end thereof which faces said first end surface of said semiconductor pellet structure;
a second lead electrode having a thermal expansion coefficient much greater than that of said semiconductor pellet structure, said second lead electrode having a header portion at one end thereof which faces said second end surface of said semiconductor pellet structure;

first means, disposed between and contiguous with said first end surface of said semiconductor pellet structure and the header portion of said first lead electrode, for fixedly securing said first lead electrode to said semiconductor pellet structure and including soft solder material having a low melting point which is contiguous with both said first end surface of said semiconductor pellet structure and the header portion of said first lead electrode;

second means, disposed between and contiguous with said second end surface of said semiconductor pellet structure and the header portion of said second lead electrode, for fixedly securing said second lead electrode to said semiconductor pellet structure and including said soft solder material having said low melting point which is contiguous with both said second end surface of said semiconductor pellet structure and the header portion of said second lead electrode; and moulded glass material for passivating said at least one pn junction and being contiguous with the entire lateral circumferential surface of said semiconductor pellet structure and having a thermal expansion coefficient approximating that of said semiconductor pellet structure; and wherein said low melting point of said soft solder material is lower than the melting point of said moulded glass material.

8. A glass-moulded semiconductor device according to claim 7, wherein each of said first and second means includes a stopper, made of a material which prevents the mutual diffusion of the semiconductor material of said semiconductor pellet structure and the material of each of said lead electrodes into each other, having opposite surfaces contiguous with and disposed between layers of said soft solder material.

9. A glass-moulded semiconductor device according to claim 8, wherein at least the header portion of each lead electrode includes a film of material to which said glass material is non-adhesive.

10. A glass-moulded semiconductor device according to claim 9, wherein each lead electrode has a flange portion spaced apart from the header portion thereof, said moulded glass being confined between the flange portions of said lead electrodes.

11. A glass-moulded semiconductor device according to claim 10, wherein said film of material to which said glass material is non-adhesive extends to include the flange portions of said lead electrodes.

12. A glass-moulded semiconductor device according to claim 8, wherein said semiconductor pellet structure is made of silicon, each lead electrode is made of copper, and said soft solder material is a lead-silver-tin solder.

13. A glass-moulded semiconductor device according to claim 7, wherein said semiconductor pellet structure has a mesa configuration one of said first and second end surfaces of which has a diameter corresponding to that of the header portion of the lead electrode to which it is fixedly secured.

14. A glass-moulded semiconductor device according to claim 13, wherein each of said first and second means includes a stopper, made of a material which prevents the mutual diffusion of the semiconductor material of said semiconductor pellet structure and the material of each of said lead electrodes into each other, having opposite surfaces contiguous with and disposed between layers of said soft solder material.

15. A glass-moulded semiconductor device according to claim 14, wherein each of the first and second end surfaces of said semiconductor pellet structure is provided with a film of a material which is contiguous with the semiconductor material of said pellet structure and said soft solder material, and is made of a material to which said soft solder material readily adheres.

16. A glass-moulded semiconductor device according to claim 15, wherein each of said stoppers is made of a material the thermal expansion coefficient of which is intermediate those of the semiconductor material of said pellet structure and the material of said lead electrodes.

17. A glass-moulded semiconductor device according to claim 16, wherein said semiconductor pellet structure is made of silicon, each lead electrode is made of copper, each stopper is made of an iron-nickel alloy, and said soft solder material is a lead-silver-tin solder.

18. A glass-moulded semiconductor device according to claim 7, wherein the header portion of each electrode includes a stopper made of a material which prevents the mutual diffusion of the semiconductor material of said semiconductor pellet structure and the material of the lead electrode into each other, the soft solder material being contiguous with one surface of said stopper.

19. A glass-moulded semiconductor device according to claim 18, wherein at least the header portion of each lead electrode includes a film of material to which said glass material is non-adhesive.

20. A glass-moulded semiconductor device according to claim 19, wherein each lead electrode has a flange portion spaced apart from the header portion thereof, said moulded glass being confined between the flange portions of said lead electrodes.

21. A glass-moulded semiconductor device according to claim 18, wherein each of said stoppers is made of a material the thermal expansion coefficient of which is intermediate those of the semiconductor material of said pellet structure and the material of said lead electrodes.

22. A glass-moulded semiconductor device according to claim 21, wherein said semiconductor pellet structure is made of silicon, each lead electrode is made of copper, each stopper is made of an iron-nickel alloy, and said soft solder material is a lead-silver-tin solder.

23. A glass-moulded semiconductor device according to claim 18, wherein the entirety of the header portion of each electrode is formed of said stopper.

24. A glass-moulded semiconductor device according to claim 7, wherein each of said first and second means consists exclusively of a thin layer of said soft solder material, and wherein said first and second end surfaces of said semiconductor pellet structure and the surfaces of each of said header portions of said lead electrodes are provided with films of material which prevent the mutual diffusion of the semiconductor material of said semiconductor pellet structure and the material of each of said lead electrodes into each other, contiguous with the respective thin layers of soft solder material therebetween.

25. A glass-moulded semiconductor device according to claim 24, wherein the header portion of each lead electrode has a frusto-conical configuration and has at least one axial recess in the surface thereof into which said moulded glass material penetrates.

26. A glass-moulded semiconductor device according to claim 24, wherein the header portion of each lead electrode has a frusto-conical configuration and has at least one projection on the surface thereof surrounded by the moulded glass material.

27. A glass-moulded semiconductor device according to claim 24, wherein said films of materials are films of a material to which said glass material is non-adhesive.

28. A glass-moulded semiconductor device according to claim 27, wherein said semiconductor pellet structure is made of silicon, each lead electrodes is made of copper, said soft solder material is lead-silver-tin solder, and said films of material are made of nickel.

* * * * *